United States Patent [19]

Nagumo

[11] Patent Number: 4,819,032
[45] Date of Patent: Apr. 4, 1989

[54] BELT TENSIONING MECHANISM IN A THERMALLY DEVELOPING APPARATUS

[75] Inventor: Akihiko Nagumo, Kanagawa, Japan

[73] Assignee: Fuji Photo Film Co., Ltd., Kanagawa, Japan

[21] Appl. No.: 145,957

[22] Filed: Jan. 20, 1988

[30] Foreign Application Priority Data

Jan 20, 1987 [JP] Japan .................... 62-9157

[51] Int. Cl.⁴ .............. G03B 27/32; G03B 27/52; G03B 27/30
[52] U.S. Cl. .................... 355/27; 355/106
[58] Field of Search ............. 355/27, 106, 104, 105, 355/108

[56] References Cited

U.S. PATENT DOCUMENTS 3,211,451 10/1965 Masterson .............. 355/106 X
3,547,538 12/1970 Yanagawa .............. 355/106
3,565,523 2/1971 Davis et al. ............ 355/106
4,760,426 7/1988 Taniguchi et al. ....... 355/27

Primary Examiner—Richard A. Wintercorn
Attorney, Agent, or Firm—Sughrue, Mion, Zinn, Macpeak, and Seas

[57] ABSTRACT

An apparatus for thermally developing a photosensitive material having an image produced by image-like exposure, comprising a heating roller, a plurality of support rollers, and a rotating endless belt stretched around these rollers. At least one of the support rollers is movable along its radius. A tension adjusting mechanism pushes the roller outwardly from the belt. The support rollers may have a flange on each end for preventing slippage of the endless belt from the rollers.

5 Claims, 3 Drawing Sheets

BELT TENSIONING MECHANISM IN A THERMALLY DEVELOPING APPARATUS

BACKGROUND OF THE INVENTON

1. Field Of The Invention

This invention relates to a thermally developing apparatus which thermally develops a photosensitive material having an image produced by image-like exposure.

2. Background Art

As an example of an image recording material using microcapsules which contain a photosensitive composition, a system is known which utilizes a synthetic macromolecule resin wall capsule containing a vinyl compound, a photosynthesis initiator and a coloring agent precursor on a support, as disclosed in, for example, Japanese Published Unexamined Patent Application 179836/1982. An image recording method using this system includes the steps of hardening the microcapsules in an image-like manner by exposure. bursting the unhardened microcapsule by pressurization and obtaining a color image from the emitted coloring agent precursor. This method has the feature that it provides a high quality image by simple dry processing. However, this system has the drawback that it has a very low photosensitivity compared to a system using silver halide.

A novel recording material which has a high photosensitivity and provides a high quality image by simple dry processing is disclosed in Japanese Patent Application 117089/1985 filed by this Applicant. This recording material includes a photosensitive composition which comprises at least a photosensitive silver halide, a reducing agent, a polymerizing compound and a color image forming material coated on a support with at least the polymerizing compound and color image forming material being encapsulated.

A method of recording an image using this photosensitive material is disclosed in Japanese Patent Application 121284/1985 filed also by this Applicant. This image recording method includes the steps of first forming a latent image by image-like exposure, performing thermal development, and polymerizing that part of the polymerizing compound where the latent image exists to produce a high molecular compound to thereby harden the microcapsules. It further includes the steps of superposing and pressing together the sheet containing the hardened microcapsules and an image receiving material having an image receiving layer to which the color image forming material can be transferred, bursting at least a portion of that area of the microcapsule sheet where no latent image exists, and transferring the color image forming material to the image receiving material to obtain an image on the image receiving material.

An image recording device which automatically uses the same photosensitive material as that mentioned, performs image-like exposure of the material, thermally develops the material, superposes and pressurizes the resulting material and an image receiving material to thereby transfer an image to the image receiving material is disclosed in, for example, Japanese Patent Application 51896/1986 also filed by this Applicant.

In an image recording device of this type, the thermally developing device is supported by, for example, a heating roller which is heated to about 120° C. and an endless belt supported by a belt support roller and wound around the outer periphery of the heating roller over its circular arc of about 270° whereby a photosensitive material is held and carried between the heating roller and endless belt to thereby be heated.

The photosensitive material is pressed against the heating roller by the tension of the endless belt in order to be heated and developed. Therefore, in order to perform good thermal development, for example, an endless belt 32 cm wide must be stretched at a constant tension of 2–5 kg per width However, it is difficult to manufacture endless belts having the same peripheral length. An endless belt may be lengthened by heating compared to its length at room temperature. Therefore, the tensions of endless belts used are not constant, but may be too high or too low.

If the tension of an endless belt is too high, the photosensitive material will be too strongly pressed against the heating roller, so that the microcapsules are crushed before they are thermally hardened to thereby provide no proper copied image.

If the tension of the endless belt is too low, the belt is likely to shift laterally on the support roller to slip off from the support roller to render it impossible to heat and carry the photosensitive material. In addition, the pressing force against the heating roller is insufficient, so that part of the photosensitive material floats from the heating roller, the moisture evaporated from the photosensitive material or the support is deposited or collected on the floated portion to thereby expedite the development to produce uneven image quality or wrinkles in the photosensitive material.

SUMMARY OF THE INVENTION

Therefore, it is an object of this invention to provide a thermally developing apparatus which solves the above problems and in which the endless belt is stretched at an appropriate tension at all times.

The object of this invention is achieved by an apparatus for thermally developing a photosensitive material having an image produced by image-like exposure, comprising a heating roller, a plurality of support rollers, and a rotating endless belt stretched around these rollers, at least one of the support rollers being movable radially thereof, and a tension adjusting mechanism for pushing the movable roller outwardly from the belt.

At least one of the plurality of support rollers supporting the endless belt has a tension adjusting mechanism, so that the endless belt is stretched under a constant tension at all times to thereby press the photosensitive material against the heating roller under a predetermined pressure at all times.

As an example of the photosensitive material used in this invention, a material of the type in which polymerizing compounds are hardened in an image-like manner by image-like exposure and then pressurized to obtain a visible image is disclosed in Japanese Published Unexamined Patent Application 179836/1982, also filed by this Applicant. The material carries synthetic macromolecule resin wall capsules containing a vinyl compound, a photosynthesis initiator and a coloring agent precursor on a support.

Furthermore, a material of the type in which the contained silver halide is exposed in an image-like manner, thermally developed while the polymerizing compounds are being hardened at the same time, and pressure is applied to the hardened compound to provide a visible image is disclosed in Japanese Patent Application 121284/1985, also filed by this Applicant. This method includes transferring a color image forming material onto an image receiving material having an image receiving layer after thermal development and developing to thereby form an image on the image receiving material. The material includes at least photosensitive silver halide. a reducing agent. a polymerizing compound and a color image forming material coated on a support with at least the polymerizing compounds and color image forming material being encapsulated in the same microcapsule.

DETAILED DESCRIPTION OF THE PREFERRED EMBODIMENTS

Figure 1:
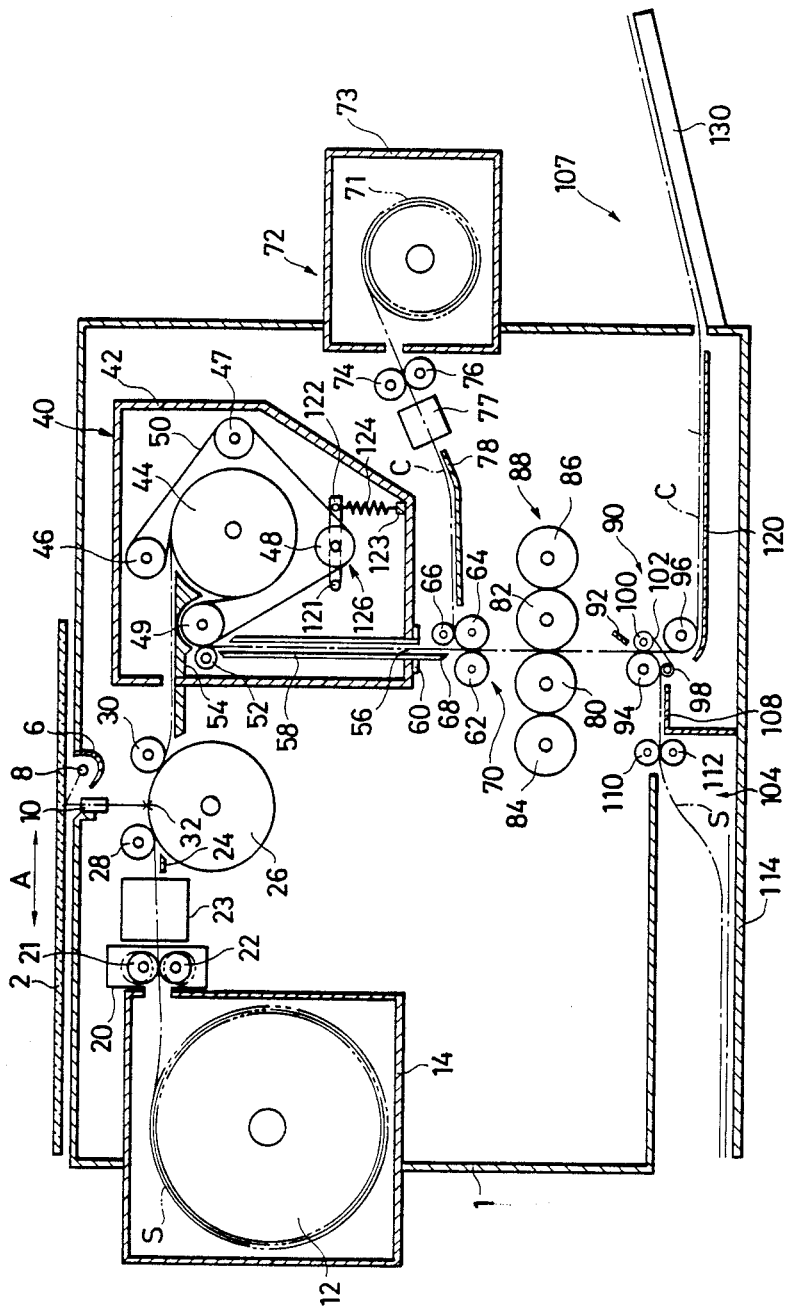
FIG. 1 is a cross-section view of an image recording device having a thermally developing apparatus according to this invention.

Embodiments of this invention will now be described with reference to the accompanying drawings. FIG. 1 is a cross-section view of an image recording device having a thermally developing apparatus according to this invention. The image recording device includes a document support glass plate 2 movable in the direction of the arrow A on an upper surface of a housing 1. The document is placed on the glass plate 2 so as to face downwardly and is moved reciprocally along with the glass plate 2 in the direction of the arrow A.

Provided under the glass plate 2 is an illumination lamp 8 with a reflective mirror 6 to illuminate an original document. A fiber lens array 10 is provided to form a document image at a predetermined position on a photosensitive material S.

A photosensitive material cartridge 14, which accommodates a roll 12 of a photosensitive material S, is mounted on the side of the housing 1. A pair of photosensitive material feed rollers 21 and 22 accommodated within a magazine connection dark box 20 are disposed at an exit 16 for the photosensitive material S of the cartridge 14 so that the material S wound around the roll 12 is fed by a constant length at a predetermined time and is retracted as needed.

When the leading end of the photosensitive material S approaches the rollers 21 and 22, the rollers 21 and 22 move away from each other. as shown by the phantom lines, so as to expedite the movement of the photosensitive material S. A cutter unit 23 to cut away the photosensitive material S and a guide plate 24 are disposed after the dark box 20 (hereinafter, "after" means downstream of the dark box. involving the direction of advancement of the photosensitive material).

A photosensitive material support roller 26 and two photosensitive material nipping rollers 28 and 30 pressed against the support roller 26 are disposed after the guide plate 24. The photosensitive material S guided by the guide plate 24 is put into close contact with the support roller 26 by nipping rollers 28 and 30 so that image-like exposure of an original document is performed by the fiber lens array 10 at a position 32 between the nipping rollers 28 and 30.

A thermally developing unit 40 is disposed after the support roller 26 in order to thermally develop the exposed photosensitive material S The developing unit 40 includes a developer housing 42 of a heat insulating material. A heating roller 44 is disposed within the housing 42 and is heated to about 120° C. An endless belt 50 is supported by four belt support rollers 46, 47, 48 and 49 and is wound around the outer periphery of the heating roller 44 over a circular arc of about 270°. A nipping roller 52 presses against the support roller 49. A tension adjusting unit 126 is provided on the support roller 48.

The developing unit 40 further includes a guide unit 54 which guides the photosensitive material S fed from the photosensitive material support roller 26 onto the heating roller 44 and which moves the photosensitive material S away from heating roller 44 after thermal development. A vertical guide unit 58 guides the developed photosensitive material S fed by the belt support roller 49 and nipping roller 52 to an exit 56. A sensor 60 senses the leading end of the photosensitive material provided at the exit 56.

Provided under the exit 56 is a photosensitive material and image receiving paper superposing unit 70 which includes a pair of press rollers 62 and 64 and a nipping roller 66 presses against the press roller 64. A guide member 68 guides the photosensitive material S fed by the press roller 64 and the nipping roller 66 to the mouth between the press rollers 62 and 64.

Disposed laterally from the paper superposing device 70 is an image receiving paper feed device 72 which includes an image receiving paper cartridge 73 removably fixed to the housing 1 and supporting an image receiving paper roll 71 by means of a support base. Disposed within the cartridge 73 are a pair of feed rollers 74 and 76, a cutter unit 77 and a guide plate 78.

Provided below the paper feed device 70 is a transfer device 88, which includes a pair of nipping rollers 80 and 82, and a pair of backup rollers 84 and 86, which axially equalize the pressures applied by the rollers 80 and 82. The rollers 80 and 82 are pressed against each other by a pressure of about 500 kg/cm$^2$.

Provided below the transfer device 88 is a photosensitive material and image receiving paper separating device 90 which includes a guide 92, a first feed roller 94 and a second feed roller 96. A separating belt 102 is stretched around guide rollers 98 and 100 so that it is pressed against only the photosensitive material S at both outer ends of the first feed roller 94.

A photosensitive material discharge unit 104 is provided on one side of the separating unit 90 while an image receiving paper take-out unit 107 is provided on the other side of the unit 90. The photosensitive material discharge unit 104 includes a guide member 108, a pair of feed rollers 110 and 112, and a discharge box 114. The photosensitive material S fed from the separating unit 90 and guided by the guide member 108 is fed into the discharge box 114 by means of feed rollers 110 and 112.

A take-out tray 130, which receives sheets of image receiving paper C from the guide member 120 is attached to image receiving paper take-out unit 107 so that it protrudes from the housing 1.

The image recording device includes a controller (not shown) which is connected to illumination lamp 8, the photosensitive material feed rollers 21 and 22, the cutter unit 23, the original document support glass plate 2, a photosensitive material end sensor 60 and the photosensitive material and image receiving paper superposing device 70 in order to perform the following operations. The end of the photosensitive material S should be within the magazine connection box 20 during preparation for the operation, so-called copying stage. of the image recording device.

When a copy start button (not shown) is then pressed, the photosensitive material feed rollers 21 and 22 operate to feed the photosensitive material S. Immediately before the leading end of the photosensitive material S reaches the position 32, the illumination lamp 8 is lit to illuminate an original document. When the leading end of the photosensitive material S reaches the position 32, the original document support glass 2 moves, the photosensitive material S is fed correspondngly, and the original document image is projected onto the photosensitive material S for the purpose of image-like exposure. When the photosensitive material S is fed by a length equal to that of the original document in the direction of movement of the material S, the cutter unit 23 operates to cut off the photosensitive material S. Thereafter, the photosensitive material feed rollers 21 and 22 rotate in the direction in which the photosensitive material S is retracted so that the end of the photosensitive material S is within the magazine connection dark box 20.

The cut-off and exposed photosensitive material S is fed to the developing unit 40, pressed by the endless belt 50 against the heating roller 44. heated to about 120° C. and developed. The photosensitive material end sensor 60 senses the passage of the end of the photosensitive material S at the exit 56.

At the image receiving paper feed unit 72, the image receiving paper C is fed from the cartridge 73 synchronously with the pressing of the copy start button or the timing of the exposure start and is cut off by the cutter unit 77 to a predetermined length. The resulting sheet of paper C is then fed to a position where its end is nipped by the press rollers 64 and nipping roller 66 and is there stopped.

At the photosensitive material and image receiving paper superposing device 70, the sheet of image receiving paper C is superposed on the photosensitive material S, is fed to the transfer unit 88, pressed against the photosensitive material S by a pressure of about 500 kg/cm$^2$ for transfer of the image to the image receiving paper, and then fed to the take-out tray 130 by means of feed roller 96.

While this invention has been described using the original document table moving type device, a similar operation may be performed using an original document table exchange type device.

A tension adjusting unit 126 of the thermally developing unit 40 includes a swing arm 122 supported at one end rotatably by a pivot 121, a support roller 48, and a coil spring 124 for pushing the free end of swing arm 122 against the fixed portion 123. Pivoted in the vicinity of the pivot 121 of the swing arm 122 is a support roller 48 which supports the endless belt 50. The support roller 48 is rotatable around the pivot 121 together with the swing arm 122. Therefore, the support roller 48 holds the endless belt 50 in a tensioned state by the action of lever of the swing arm 122 due to the resiliency of coil spring 124. The tension of the endless belt 50 may be set to a predetermined value by selecting a coil spring 124 having an appropriate resiliency.

Figure 2:
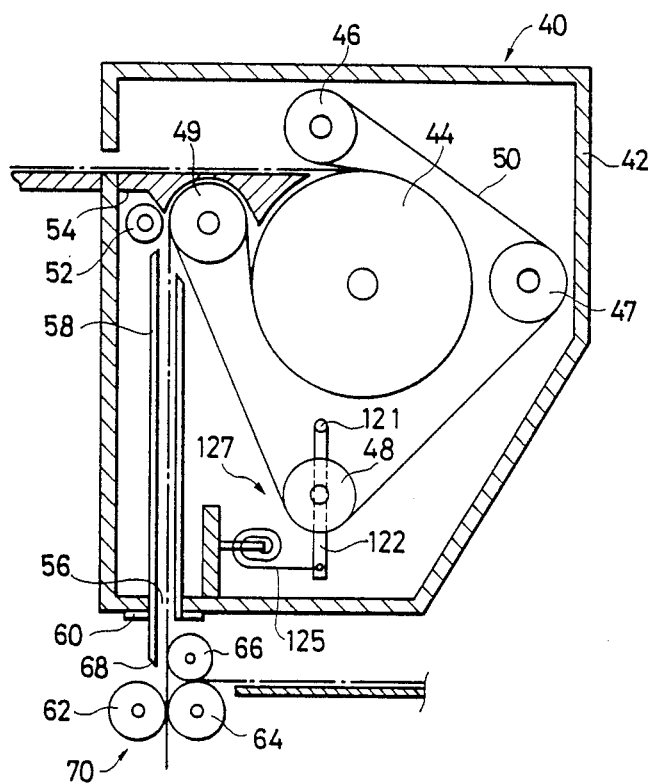
FIGS. 2 and 3 are cross section views of other embodiments a thermally developing apparatus according to this invention.

FIG. 2 is a cross-section view of a thermally developing apparatus having a tension adjusting unit 127 as another embodiment. In this embodiment, a constant-tension spring 125 is used instead of the coil spring 124 of FIG. 1. The other remaining structure is similar to that of the above embodiment of FIG. 1. The constant-tension spring 125 is spirally wound with multiple turns of a spring material. Since the constant-tension spring 125 produces a constant acting force in spite of its quantity of deformation, it ensures a constant tension even if the endless belt 50 may be extended when the developing unit 40 is being driven.

Figure 3:
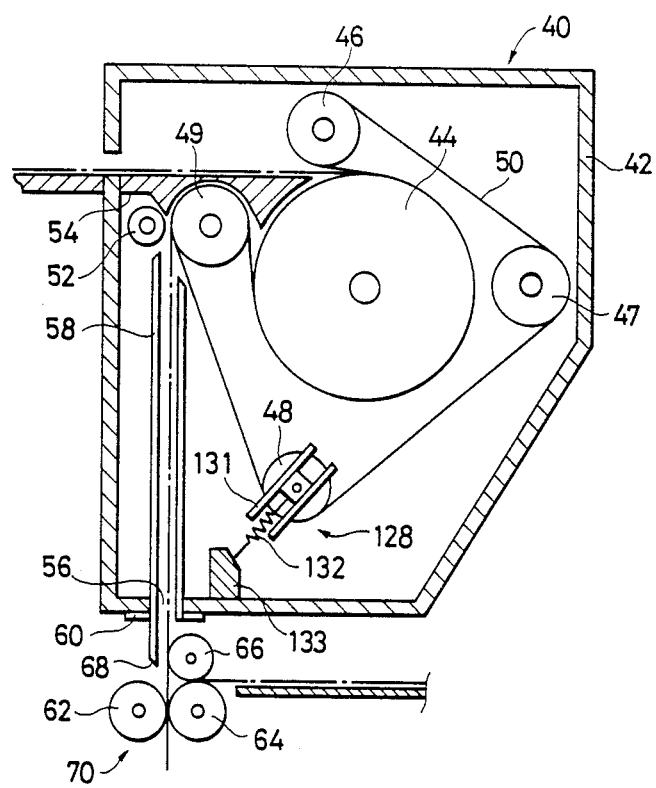

FIG. 3 is a cross-section view of a thermally developing apparatus having a tension adjusting unit 128 as a further embodiment. A support roller 48 is movably supported along a slide member 131. A coil spring 132 acts on the support roller 48 along the slide member 131. A fixing unit 133 fixes one end of the coil spring 132 to the developing housing 42.

While in these embodiments. the extension spring is used as acting on the support roller 48, this invention is not limited to it, and the member acting on the support roller 48 may be constituted by a compression spring.

The tension adjusting unit in this invention is not limited to the above embodiments, but it may take any structure as long as it applied a constant-tension to the endless belt 50.

Figure 4:
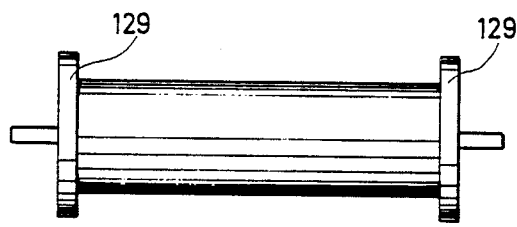
FIG. 4 is a front view of a flanged support roller.

The endless belt 50 can effectively be prevented from shifting laterally on the support rollers 46, 47, 48 and 49 by forming a flange such as 129 in FIG. 4 on each end of the rollers 46, 47, 48 and 49 of the developing unit 40.

According to this invention, since the endless belt is stretched at all times under a predetermined tension by the tension adjusting mechanism, an unhardened microcapsule is prevented from being crushed by too large a tension and uneven and/or wrinkled image is prevented from being produced due to too low a tension, and the endless belt is prevented from slipping off from the support roller to avoid rendering the transportation impossible. Thus, the thermally developing apparatus according to this invention ensures good transportation and heating of the photosensitive material.

What is claimed is:

1. An apparatus for thermally developing a photosensitive material having an image produced by image-like exposure, comprising:
    a heating roller;
    a plurality of support rollers, and a rotating endless belt stretched around these rollers, a photosensitive material being pressed between said belt and heating roller being thereby developed, wherein at least one of said support rollers is movable radially thereof; and
    further comprising a tension adjusting mechanism for pushing said one roller outwardly from said belt.

2. An apparatus of claim 1, wherein the support rollers have a flange on each end.

3. An apparatus of claim 1, wherein said tension adjusting mechanism comprises a pivoted lever supporting said one support roller and biased outwardly from said belt.

4. An apparatus of claim 3, wherein said tension adjusting mechanism further comprises a constant tension spring connected to said lever for biasing said lever outwardly of said belt.

5. An apparatus of claim 1, wherein said tension adjusting mechanism comprises a slide and a support slidable in said slide, biased outwardly from said belt and supporting said one support roller.

* * * * *